United States Patent
Trisnadi et al.

(10) Patent No.: US 7,286,155 B1
(45) Date of Patent: Oct. 23, 2007

(54) OPTICAL ENGINE USING ONE-DIMENSIONAL MEMS DEVICE

(75) Inventors: Jahja I. Trisnadi, Cupertino, CA (US); Clinton B. Carlisle, Palo Alto, CA (US)

(73) Assignee: Silicon Light Machines Corporation, San Jose, CA (US)

( * ) Notice: Subject to any disclaimer, the term of this patent is extended or adjusted under 35 U.S.C. 154(b) by 396 days.

(21) Appl. No.: 10/853,030

(22) Filed: May 25, 2004

Related U.S. Application Data

(60) Provisional application No. 60/474,717, filed on May 30, 2003.

(51) Int. Cl.
*B41J 27/00* (2006.01)
(52) U.S. Cl. .................................... 347/244; 347/258
(58) Field of Classification Search ........ 347/237–244, 347/247–261, 230–231; 355/69, 77, 53; 358/300; 359/69, 279, 719; 250/235
See application file for complete search history.

(56) References Cited

U.S. PATENT DOCUMENTS

| | | | | |
|---|---|---|---|---|
| 4,541,712 A | * | 9/1985 | Whitney | .................... 355/53 |
| 4,884,083 A | * | 11/1989 | Loce et al. | ................. 347/259 |
| 5,260,799 A | * | 11/1993 | Loce et al. | ................. 358/300 |
| 5,652,666 A | * | 7/1997 | Florence et al. | ............... 359/22 |
| 6,215,579 B1 | | 4/2001 | Bloom et al. | |
| 6,229,650 B1 | | 5/2001 | Reznichenko et al. | |
| 6,304,319 B1 | * | 10/2001 | Mizutani | ..................... 355/69 |
| 6,377,293 B2 | | 4/2002 | Koh et al. | |
| 6,577,429 B1 | * | 6/2003 | Kurtz et al. | ................. 359/279 |
| 6,636,339 B2 | | 10/2003 | Lee | |
| 6,770,866 B2 | * | 8/2004 | Retschke et al. | ........... 250/235 |
| 6,977,780 B2 | * | 12/2005 | Matsumoto et al. | ........ 359/719 |
| 7,092,000 B2 | * | 8/2006 | Katzir et al. | ................. 347/255 |
| 2005/0073670 A1 | * | 4/2005 | Carroll | ....................... 355/77 |

\* cited by examiner

*Primary Examiner*—Hai Pham
(74) *Attorney, Agent, or Firm*—Okamoto & Benedicto LLP

(57) ABSTRACT

In one embodiment disclosed, an optical engine includes a light modulator coupled to illumination optics and imaging optics. The light modulator may be located at about an object plane. The imaging optics may include a scanner and a spatial filter located at about a transform (or pupil) plane. The scanner coupled with the light modulator may be configured to generate a continuous two-dimensional swath pattern for applications such as wafer processing, printed-circuit board (PCB) patterning/printing, and/or liquid crystal display (LCD) screen printing/patterning systems. Also, a method is disclosed that uses a high-speed one-dimensional light includes controlling a scanner in an optical engine system. The system may be used to provide a two-dimensional swath pattern. The system may use a continuous wave (CW) or other high repetition rate laser source and may provide a printing speed of greater than one Gpixel per second.

7 Claims, 7 Drawing Sheets

OPTICAL ENGINE USING ONE-DIMENSIONAL MEMS DEVICE

CROSS-REFERENCE TO RELATED APPLICATIONS

The present application claims the benefit of U.S. provisional patent application No. 60/474,717, entitled "Optical Engine Using a One-Dimensional MEMS Device," filed May 30, 2003, by inventors Jahja I. Trisnadi and Clinton B. Carlisle, the disclosure of which is hereby incorporated by reference in its entirety.

BACKGROUND OF THE INVENTION

1. Field of the Invention

The present invention relates generally to micro electromechanical systems (MEMS) and, more particularly, to printing and/or maskless lithography systems using one-dimensional light modulators.

2. Description of the Background Art

A MEMS or micro electromechanical systems (MEMS) device typically includes micromechanical structures or light modulators that may be actuated using electrical signals. The MEMS light modulators may comprise, for example, Grating Light Valve™ (GLV®) light modulators available from Silicon Light Machines, having a place of business in Sunnyvale, Calif. (GLV® and Grating Light Valve™ are trademarks of Silicon Light Machines). A light modulator may include an array of moveable structures referred to as "ribbons." Light modulators may be used in various applications, including video, printing, optical switching, and maskless lithography, as just a few general examples.

A MEMS device used in a maskless lithography and/or printing application may include a two-dimensional type of MEMS device (i.e., a two-dimensional array of "pixels") or a one-dimensional MEMS device (i.e., a one-dimensional array of pixels). For many applications requiring very high lithographic resolution, such as leading edge semiconductor processing, a two-dimensional MEMS device may be used to provide a suitable solution. However, for many other applications, such as printed-circuit board (PCB) patterning/printing, liquid crystal display (LCD) screen printing systems, and/or relatively moderate range semiconductor processing, a one-dimensional MEMS device may be used to provide a suitable solution. Advantages of using such a MEMS device include relatively low production costs. However, configuring an optical system to cover a two-dimensional image space may result in an overly complex printing system.

It would be desirable to have an optical engine using a one-dimensional MEMS configured to paint two-dimensional patterns with a relatively simple system design.

SUMMARY

In one embodiment, an optical engine includes a light modulator coupled to illumination optics and imaging optics. The light modulator may be located at about an object plane. The imaging optics may include a scanner located at about a transform plane. The scanner coupled with the light modulator can be configured to generate a continuous two-dimensional swath pattern for applications such as wafer processing, printed-circuit board (PCB) patterning/printing, and/or liquid crystal display (LCD) screen printing/patterning systems.

In another embodiment, a method of using a high-speed one-dimensional light includes controlling a scanner in an optical engine system. The system may be used to provide a two-dimensional swath pattern. The system may use a continuous wave (CW) or other high repetition rate laser source and may provide a printing speed of greater than one Gpixel per second.

DETAILED DESCRIPTION

Figure 1:
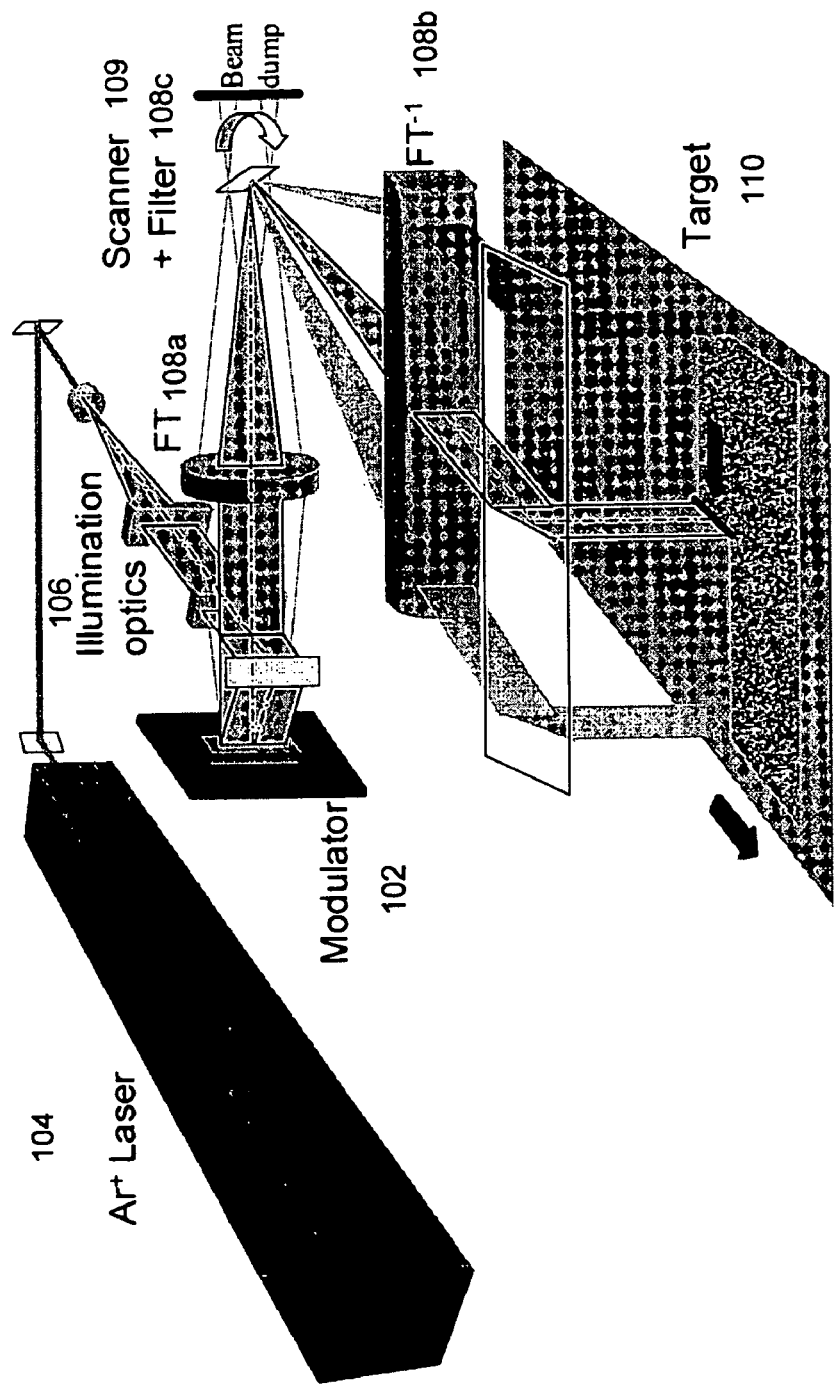
FIG. 1 illustrates an improved system configuration including an optical engine with a one-dimensional light modulator in accordance with an embodiment of the invention.

Described herein are systems using one-dimensional light modulators in optical engines configured to write two-dimensional images. FIG. 1 illustrates such an improved system configuration 100 including an optical engine with a one-dimensional light modulator 102. The light source 104, shown in the example of FIG. 1 as an Argon (Ar) laser system preferably includes a continuous wave (CW) laser source. One such example laser source 104 may be in the 333-364 nm range. As an alternative, any very high repetition rate (e.g., 10 MHz or higher) laser source could be used in this system 100. The laser source 104 must operate at a high rate or be effectively continuous in order to take advantage at the system level of the relative high speed of the light modulator. If the laser source 104 used had a relatively slow repetition rate, it would limit the printing speed of the system overall. The optical engine of FIG. 1 also may include illumination optics 106 and imaging optics 108. The imaging optics 108 may include a Fourier Transform (FT) lens 108$a$ as well as an inverse ($FT^1$) lens 108$b$. Also, the imaging optics 108 may include a spatial filter 108$c$ and a scanner 109 positioned at about the transform (or pupil) plane. The function of the spatial filter is to discriminate the selected diffraction order(s) from the discarded diffraction orders. The scanner location relative to the light modulator 102 as illustrated may provide the advantageous results of this approach. The large printing coverage at the target 110 is accomplished via a combination of scanning the optical beam and translating the target 110 in a direction approximately perpendicular to the optical scan.

Figure 2:
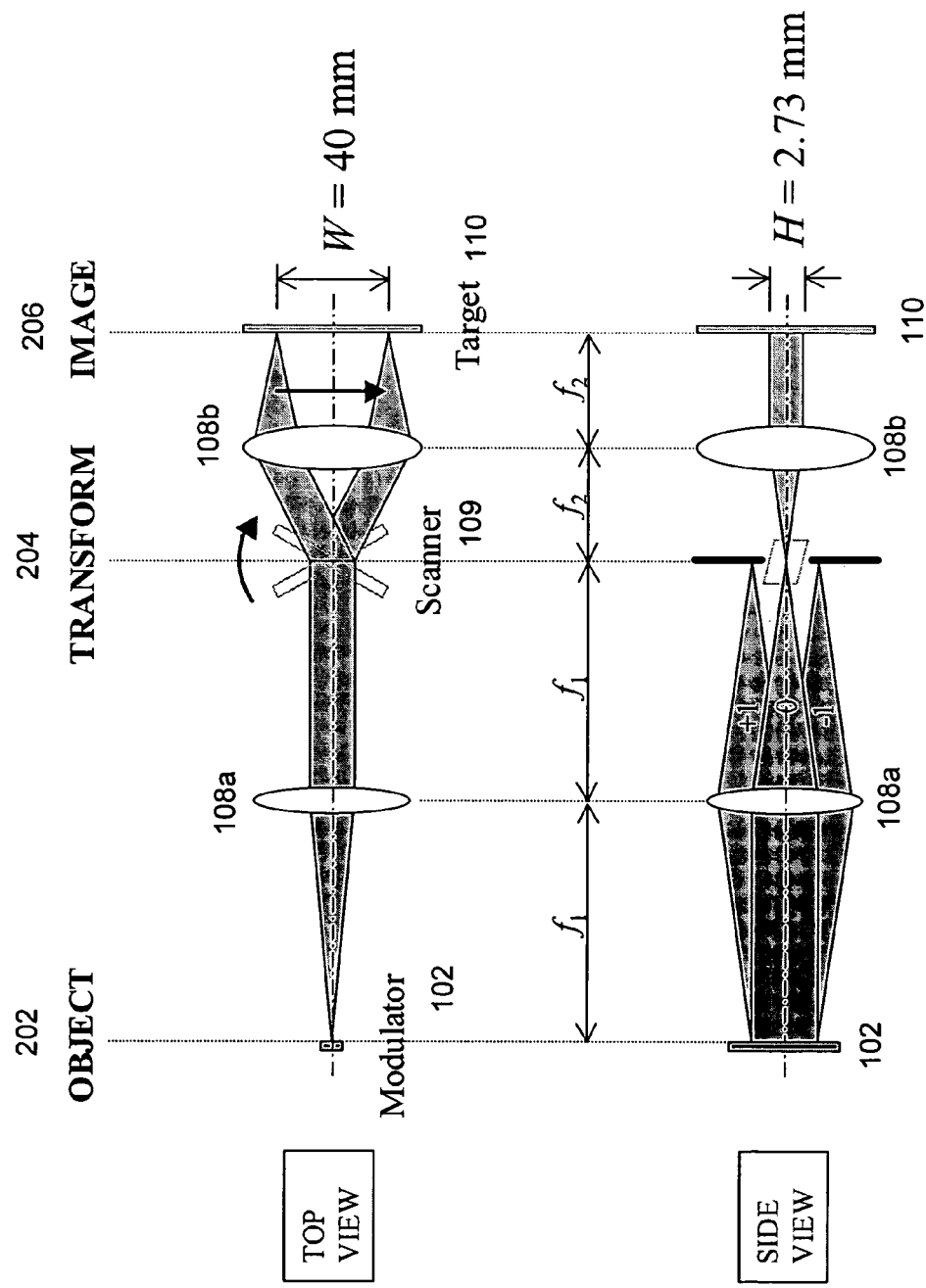
FIG. 2 illustrates top and side views of the example optical engine arrangement in accordance with an embodiment of the invention.

FIG. 2 illustrates top and side views of the optical engine of FIG. 1 and highlights the scanner position relative to the modulator for one example implementation. The modulator 102 is located at about the object plane 202 and is where the object to be imaged is processed. The FT lens 108a may be located at about a first focal length away ($f_1$) from the object plane 202. The scanner 109 may be located at about the transform plane 204, which may be $f_1$ away from the FT lens 108a. The $FT^1$ lens 108b may be located a second focal length ($f_2$) from the transform plane 204. The target 110 may be located at about the image plane 206, which may be $f_2$ from the $FT^1$ lens 108b. As shown in this example case from the top view, the width of area coverage for a scan pass on the target about the image plane may be approximately 40 millimeters (mm) in one specific implementation. Also, as shown in this example case from the side view, the height or length of area coverage for a scan pass on the target 110 about the image plane 206 may be approximately 2.73 mm in one implementation. This particular example may be used in a MEMS maskless lithography application.

Figure 3:
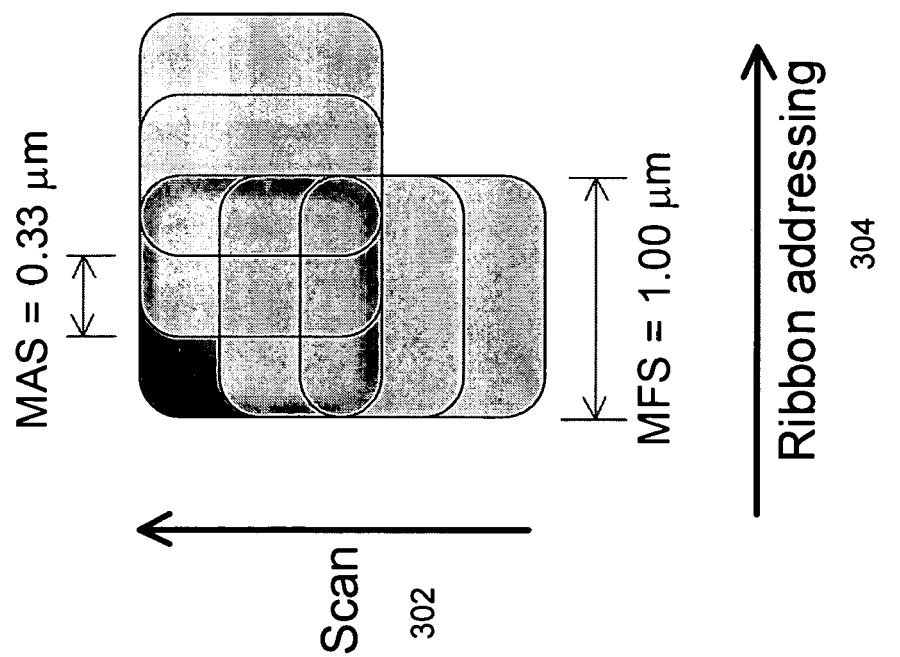
FIG. 3 illustrates an example scan direction and ribbon addressing relation in accordance with an embodiment of the invention.

FIG. 3 illustrates an example scan direction 302 and ribbon addressing 304 relation. The particular example case shown may be used for a MEMS lithography application, as discussed above with reference to FIG. 2. The Minimum Feature Size (MFS) at the target may be about 1.00 micrometer (μm) in one specific implementation. Also, the Minimum Addressable Step (MAS) at the target 110 may be about 0.33 μm in one implementation. This MAS may be obtained by addressing the MEMS elements (e.g., ribbons), in a first direction 304 while scanning in a second direction 302.

For other applications, such as PCB (printed circuit board) patterning/printing and LCD (liquid crystal display) systems, the MFS may be about 10 μm and the MAS may be about 2 μm. The corresponding width of area coverage on the target about the image plane may be approximately 500 mm for a scan pass for these other example applications.

Figure 4:
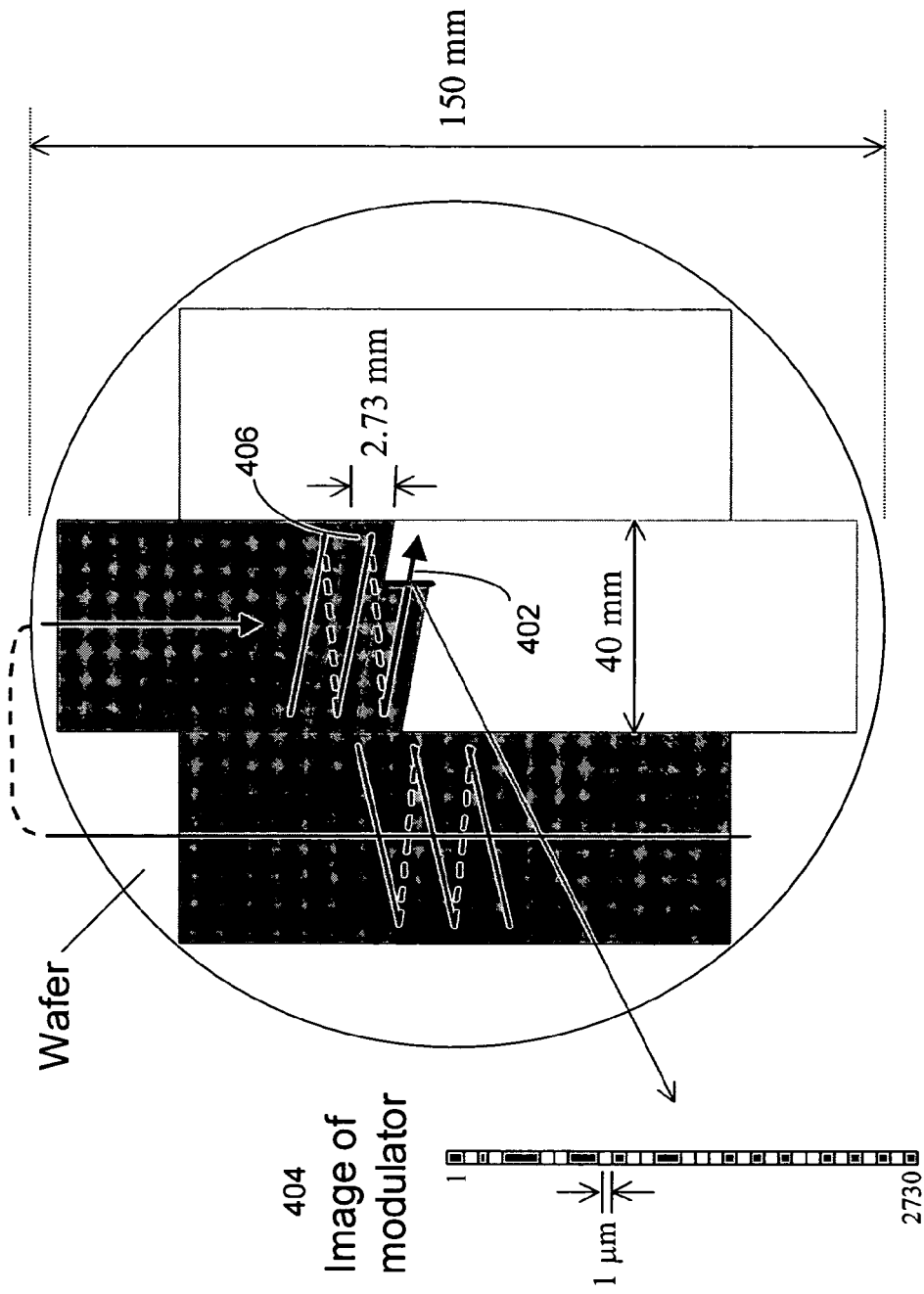
FIG. 4 is a diagram showing a scan and write format for an example wafer lithography application in accordance with an embodiment of the invention.

Turning now to FIG. 4, a diagram showing a scan and write format for an example wafer lithography application is shown. As discussed, this illustrated case is only one particular example application of this general approach. In FIG. 4, a scan direction 402 along with the associated image of the modulator 404 is shown. As one example, the modulator may include a one-dimensional array of 2730 pixels operating at about 1.2 MHz in one specific implementation. Further, 3 addresses per pixel, providing an 8-bit gray scale, may be used. As shown, the width of area coverage for a pass may: be about 40 mm and the height or length may be about 2.73 mm in one implementation. The scanning pattern includes "parallelogram swaths" 406 and may be repeated to cover essentially all of a usable wafer portion. For the example 6-inch wafer case, a wafer throughput for such a maskless lithography application may be about 2 wafers per minute. Further, the system may operate, for example, with i-line resist, a type of high-resolution resist exposed using i-line UV illumination.

Figure 5A:
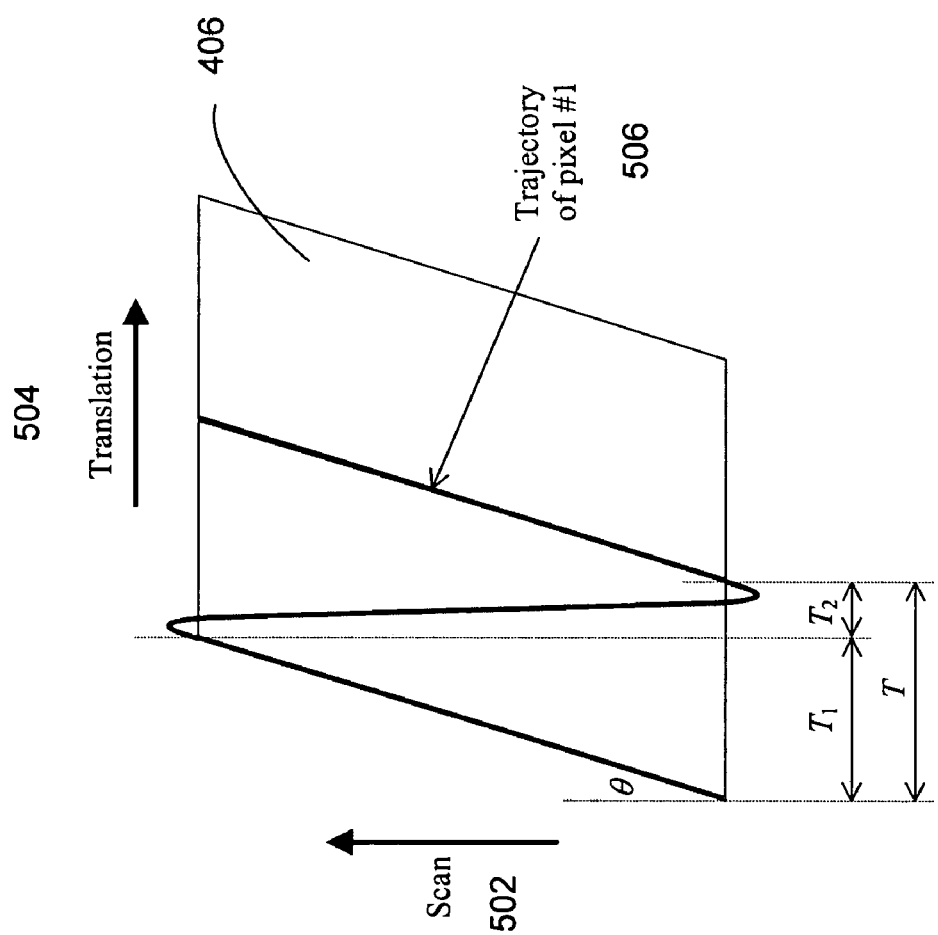
FIG. 5A is a diagram showing an example scan with a pixel trajectory in accordance with an embodiment of the invention.

FIG. 5A is a diagram showing more detail of the lithographic swaths 406 of the example scan case. This example scan with a pixel trajectory pattern may also be used, however, for non-lithographic type applications. In the implementation illustrated in FIG. 5A, the scan direction 502 is vertical and the translation direction 504 is horizontal. In another implementation, the scan direction 502 may be horizontal, and the translation direction 504 may be vertical. In yet another implementation, the scan 502 and translation 504 directions may be non-perpendicular with respect to each other.

The trajectory 506 of a given pixel (e.g., pixel #1) from the modulator 102 is shown in FIG. 5A. The other pixels of the linear modulator 102 have parallel trajectories. From this pattern, $T_1$ indicates a "write" time and $T_2$ indicates a "flyback" time. A summation ($T_1+T_2$) may form the scan period (T).

Figure 5B:
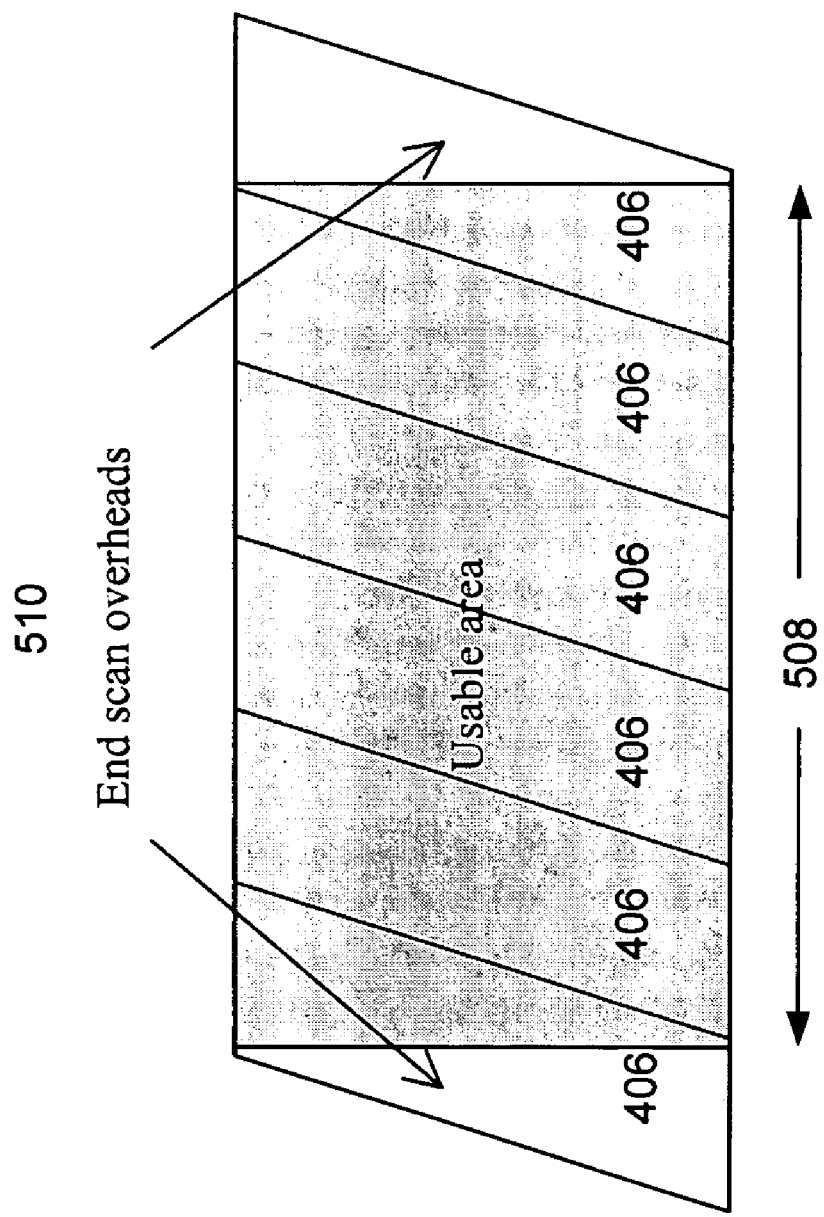
FIG. 5B illustrates a swath pattern area resulting from the scanning approach of FIG. 5A in accordance with an embodiment of the invention.

FIG. 5B illustrates a swath pattern coverage area resulting from the scanning approach of FIG. 5A. The parallelogram patterns 406 may be tiled together to form the usable area 508, as shown. Of course, other tiling schemes may be used, depending on the particular application requirements. The end parallelograms 406 (at the ends of the usable area 508) include portions 510, as shown, which are outside the usable area 508. These portions 510 may be considered as end scan overheads, because they are unusable portions.

The system as described herein may provide printing speeds in the giga pixel (Gpixel) per second range. An example using a CW (or quasi-CW) laser source with adequate average power output may deliver write speeds of greater than about 2 Gpixels/sec. Also, the relative system requirements of the laser and the associated optics are modest, resulting in a relatively simple and robust overall design.

Figure 6:
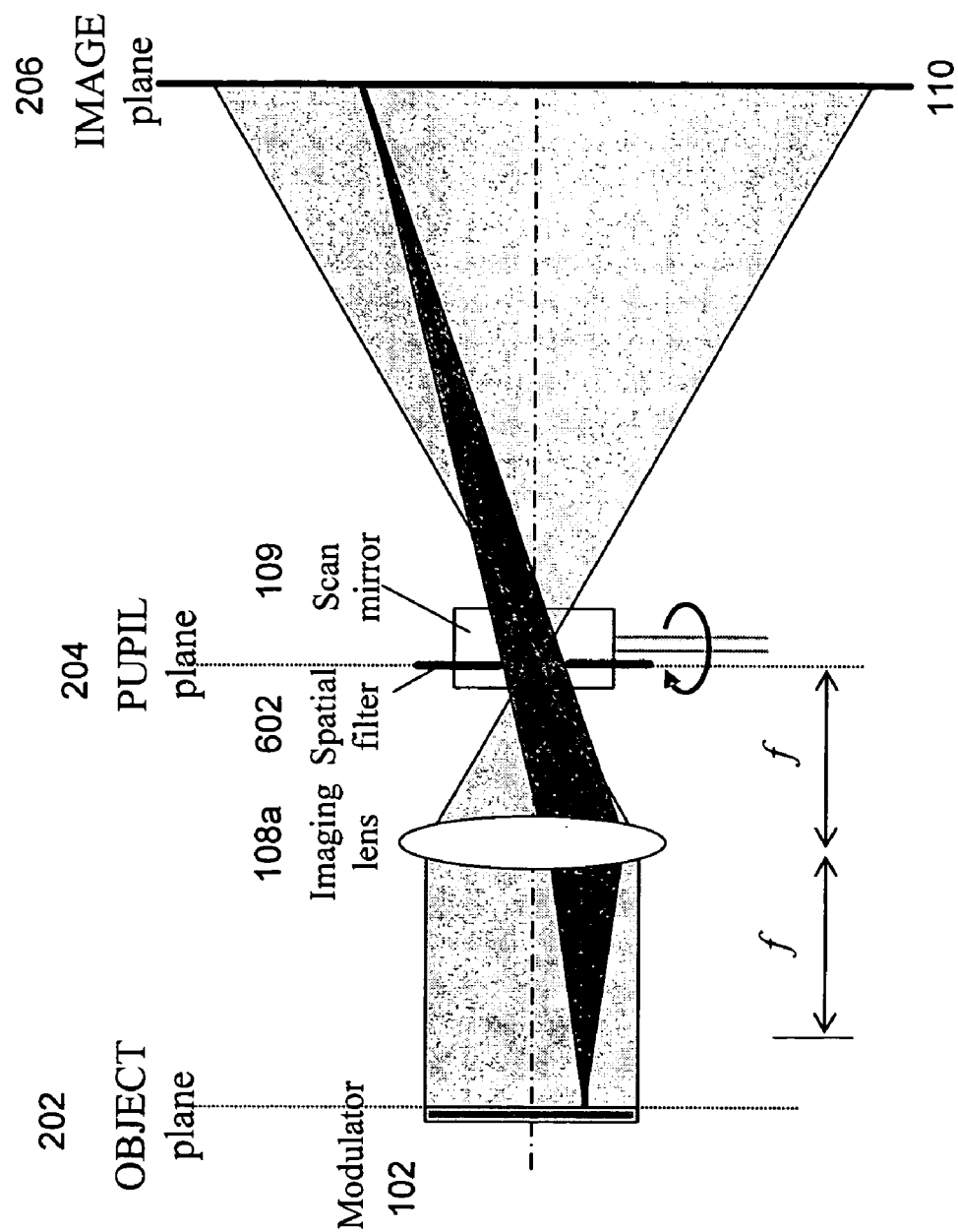
FIG. 6 illustrates an alternate optical engine arrangement with simplified imaging optics in accordance with an embodiment of the invention.

FIG. 6 illustrates an alternate optical engine arrangement with simplified imaging optics. This arrangement includes a spatial filter 602 at or at about the pupil (or transform) plane 204. A scanner 109 (for example, shown as a scan mirror that may be controllably rotated) is also included at or at about the pupil plane 204 in this arrangement. The spatial filter 602 and the scanner 109 may be integrated by having the scanner 109 reflect only the selected order.

The arrangement of FIG. 6 advantageously provides for a large image field while avoiding the need for large imaging optic components. This arrangement is non-telecentric and so has a short effective depth-of-focus.

While specific embodiments of the present invention have been provided, it is to be understood that these embodiments are for illustration purposes and not limiting. Many additional embodiments will be apparent to persons of ordinary skill in the art reading this disclosure.

What is claimed is:

1. An apparatus for two-dimensional patterning of a target substrate, the apparatus comprising:
    a light source configured to generate a beam of light;
    a one-dimensional MEMS device configured to modulate the light beam along a first linear direction so as to generate a line of light along the first linear direction with modulated pixels therein;
    a scanner configured to scan the modulated line of light across the target substrate; and
    one-dimensional imaging optics configured to focus the modulated line of light from the MEMS device onto the scanner and to project the modulated line of light from the scanner onto the target substrate,
    wherein the imaging optics comprises a fourier transform lens operating on the modulated line of light before the scanner, and an inverse transform lens in a parallel orientation as the fourier transform lens and operating on the modulated line of light after the scanner,
    a mechanism configured to translate the target substrate in a direction approximately perpendicular to a direction of scanning the modulated line of light so that the scanned modulated line of light covers a parallelogram swath on the target substrate.

2. The apparatus of claim 1, further comprising:
    illumination optics configured to focus the light beam onto the MEMS device.

3. The apparatus of claim 1, wherein the light source comprises a continuous-wave laser.

4. The apparatus of claim 1, wherein the light source comprises a high-speed pulsed laser, wherein the repetition rate is substantially faster than an operating speed of the MEMS device.

5. The apparatus of claim 1, wherein the imaging optics further comprises a spatial filter positioned at about the transform plane.

6. The apparatus of claim 1, wherein the scanner is further configured to scan a parallelogram pattern repetitively onto the target substrate.

7. The apparatus of claim 6, wherein a series of the repeated parallelogram patterns forms a usable area and end scan overhead portions.

* * * * *